United States Patent [19]

Klepner

[11] Patent Number: 4,514,254
[45] Date of Patent: Apr. 30, 1985

[54] GROUNDPLANE POST-ETCH ANODIZATION

[75] Inventor: Stephen P. Klepner, Wappingers Falls, N.Y.

[73] Assignee: International Business Machines Corporation, Armonk, N.Y.

[21] Appl. No.: 536,141

[22] Filed: Sep. 26, 1983

[51] Int. Cl.³ .......................... C23F 1/02; B44C 1/22; C03C 15/00; C03C 25/06
[52] U.S. Cl. ..................... 156/656; 29/575; 156/653; 156/657; 156/659.1; 156/667; 204/32.1; 204/38.1; 357/5; 357/65; 427/88; 428/633
[58] Field of Search .............. 357/4, 5, 65; 427/62, 427/88, 93, 95; 29/569 R, 575, 576 R, 599; 204/32 R, 32 S, 38 A, 42, 129.1, 129.65; 428/689, 632, 633; 156/648, 653, 656, 657, 659.1, 667

[56] References Cited

U.S. PATENT DOCUMENTS

| | | | |
|---|---|---|---|
| 3,436,258 | 4/1969 | Neugebauer et al. | 117/217 |
| 3,784,452 | 1/1974 | Martens et al. | 204/26 |
| 3,806,430 | 4/1974 | Laibowitz et al. | 204/32 R |
| 3,902,975 | 9/1975 | Martens | 204/35 N |

OTHER PUBLICATIONS

Broom et al., Isolation Technique for Josephson Junction Gates, IBM Tech. Disc. Bulletin, vol. 18, No. 5, Oct. 1975, p. 1558.
Mohr et al., Eliminating Structural Surface Defects During Josephson Junction Fabrication, IBM Tech. Discl. Bull., vol. 22, No. 9, Feb. 1980, p. 4199.
Drake et al., Minimization of Excess Sub–Gap Currents in Josephson Junctions, IBM Techn. Discl. Bulletin, vol. 24, No. 2, Jul. 1981, p. 1105.
Baker et al., Reproducible Current Density Josephson Junctions, IBM Techn. Discl. Bull., vol. 24, No. 2, Jul. 1981, p. 1109.

Primary Examiner—William A. Powell
Attorney, Agent, or Firm—Carl C. Kling

[57] ABSTRACT

Pinholes opened though insulating layers in Josephson integrated circuits are sealed by this post-etch anodization process. Josephson junction integrated circuits, in part, contain patterned metal films on an insulated groundplane. The patterns of conductors are created by adding a complete metal film over the insulating layers and subtractively etching to leave the desired conductor pattern. Pinholes in the underlying etch-stop insulating layer, in areas not covered by the remaining metal pattern, can be created during the subtractive etching process. Such pinholes may occur at sites made susceptible by contaminants, including flakes of process materials, which are present despite efforts to eliminate contaminants. Such pinholes provide unwanted conductive paths between the groundplane and subsequent metallization. Failures resulting from the effects of such unwanted conductive paths occur in a fashion not easily subject to identification, much less prevention. Process yields and circuit reliability are reduced. Once the integrated circuit is completed, repair is virtually impossible. This process creates seals in pinholes opened during the subtractive etching step for M2 metallization patterning, by growing niobium pentoxide specific to exposed groundplane niobium metal specific to the pinholes. The circuit wafer, after early process steps have resulted in a groundplane, insulating/spacing etch-stop layer and etched metallization pattern M2 (with possible pinholes in areas where M2 was etched away), is anodized in a medium of ammonium pentaborate dissolved in ethylene glycol for ten minutes, removed from the anodization medium, rinsed in deionized water, spun-dry and returned to the process as a pinhole-sealed intermediate process wafer at the M2 stage.

2 Claims, 3 Drawing Figures

GROUNDPLANE POST-ETCH ANODIZATION

BACKGROUND OF THE INVENTION

1. Field of the Invention

This invention relates to processes for preparing Josephson junction integrated circuits, and more particularly to a process for sealing pinholes, in a composite insulating/spacing etch-stop layer on a metal groundplane, which are opened during metallization pattern etching.

2. Description of Related Art

Typical Josephson junction integrated circuit devices include a niobium groundplane insulated with a composite insulating/spacing etch-stop layer of niobium pentoxide/silicon monoxide. The silicon monoxide operates as a dielectric layer, which provides spacing required to achieve the desired transmission line qualities, and also has very desirable etch-stop qualities. The low dielectric constant and the etch resistance of the silicon monoxide make it ideal for the purpose. Silicon monoxide deposition processes, however, are such that it is difficult to deposit a gap-free continuous layer of silicon monoxide sufficiently thin for the purpose. The layer must be thin to exhibit the desired dielectric and spacing characteristics necessary for transmission lines to carry the fast risetime superconducting signals inherent in Josephson technology. A layer of niobium pentoxide, relatively easy to grow and relatively defect-free, is commonly included under the silicon monoxide. Niobium pentoxide is not used alone (without the silicon monoxide) since it is not adequate as an etch-stop. The dual niobium pentoxide/silicon monoxide composite insulating/spacing etch-stop layer is continuous and relatively defect-free. The silicon monoxide component of the composite layer, however, suffers from the drawback that during deposition it leaves deposits on the internal surfaces of the process chamber. These deposits may flake off in minute flakes, some of which are deposited as contaminants on the wafer. Such contaminants create mechanically unstable sites for later development of pinholes. Since the sites may be microscopic flakes of the process material silicon monoxide (as well as of external contaminants), such sites are difficult to identify in the silicon monoxide etch/stop layer. Such sites are virtually impossible to repair.

Processes for developing integrated circuits over the wafer, by a sequence of metallization deposition, masking, metallization pattern etching, oxidation, etc. have been reported. In such processes, the wafer after metallization may be subjected to the corrosive environment required by subtractive etching. The etchants required are so powerful that processing, particularly the metallization patterning etch step, may create pinholes through the composite insulating/spacing etch-stop layer at susceptible sites under certain conditions, exposing the groundplane metal.

Pinhole sites, resulting from random distributions of contaminant particles and microscopic gaps in silicon monoxide coverage, occur with a statistical probability and with a statistically variable (and thus unknown) placement over the wafer.

Integrated circuit devices based on Josephson edge junctions, where very tiny Josephson junctions are placed on the edges of metallization interconnections, are particularly susceptible to faults caused by pinhole defects, because of the very thin layers required by the technology. There are no easy methods known to test for pinhole sites. The requirements of Josephson junction technology make it difficult to make the groundplane insulating/spacing etch-stop layer more robust. The layer must be thin and have the correct net dielectric constant to achieve the necessary transmission line characteristics. Dimensional requirements in the required superconductive materials (including niobium, lead and alloys such as lead-gold-indium) limit the technologies that may be used for subtractive etching. Pinholes which can expose a groundplane metal can occur. Josephson junction circuits are not generally capable of proper operation in the case of pinhole faults which might cause unwanted conductive paths. There are no easy methods known for determining the exact location of pinholes.

3. Related Prior Art Patents

U.S. Pat. No. 3,436,258 et al, METHOD OF FORMING AN INSULATED GROUND PLANE FOR A CRYOGENIC DEVICE, granted Apr. 1, 1969, shows a method of forming an insulated groundplane for a cryogenic device, which method includes the preparation of an oxide insulating layer by anodizing the film. Neugebauer et al solves the resulting pinhole problem by providing a smooth substrate and a high purity, superconductive metallic film upon which the metal oxide insulator is formed. Neugebauer et al does not, however, perform a reanodization function.

U.S. Pat. No. 3,784,452, Martens et al, METHOD OF TREATING THE SURFACE OF SUPERCONDUCTING NIOBIUM CAVITY RESONATORS, granted Jan. 8, 1974. Martens et al shows a two-step process for providing a niobium oxide layer on a niobium surface by first preoxidizing the niobium surface, chemically removing the resultant niobium oxide layer, and thereafter producing a niobium oxide layer at the niobium surface, through a renewed anodic oxidation. Martens et al does not suggest reanodization subsequent to layer growth as provided by this patent specification.

U.S. Pat. No. 3,806,430, Laibowitz et al, METHOD FOR FABRICATING ANODIC FILMS, granted Apr. 23, 1974. Laibowitz et al shows a process for chemically smoothing a metal layer by multiple anodizing and etching steps to eliminate defects such as cavities and hillocks.

U.S. Pat. No. 3,902,975, Martens, METHOD FOR TREATING NIOBIUM SURFACES USED IN AC CIRCUIT APPLICATIONS, granted Sept. 2, 1975. Martens shows a method for treating niobium surfaces by first producing an anodized niobium pentoxide layer and then removing the niobium pentoxide layer to result in a finished oxide-free product.

4. Related Prior Art Publications

Broom et al, ISOLATION TECHNIQUE FOR JOSEPHSON JUNCTION GATES, IBM Technical Disclosure Bulletin, Volume 18, Number 5, October 1975, page 1558. Broom et al shows a technique for first anodizing a niobium groundplane, then depositing a layer of silicon oxide over the niobium pentoxide layer thus formed, and finally, by treating with an RF plasma treatment to remove some silicon oxide by the oxygen plasma, convert it to silicon dioxide, and by scattering redeposit it everywhere, to cover any pinholes or previously shadowed edges. Broom et al recommends the use of silicon dioxide to seal ". . . any exposed metal surfaces at the pinholes or edges previously shadowed . . . " This is a different technique, applied at a different stage in the process (after silicon monoxide deposition) from the application of this technique (after metallization patterning etch) and does not seal pinholes opened during the metallization patterning etch step.

SUMMARY OF THE INVENTION

An object of the invention is to seal with grown oxide any pinholes in the insulated groundplane for a Josephson junction integrated circuit, by anodizing the integrated circuit wafer at an intermediate stage of processing, after the completion of process steps which tend to cause pinholes.

A more specific object of the invention is to seal, with oxide sealant layers grown from the groundplane metal itself, any groundplane exposing pinholes opened during a metallization patterning etch step taken during an intermediate stage of processing in making a Josephson junction integrated circuit.

Another object of the invention is to provide, at an intermediate stage in the integrated circuit preparation process, oxide sealant layers for pinholes opened in an insulating/spacing etch-stop layer during process steps subsequent to the steps by which the insulating/spacing etch-stop layer was originally formed.

A feature of the invention is its ability to seal pinhole faults without the need to determine the exact location of each pinhole fault. An advantage of the invention is increased process yield and increased product reliability in Josephson integrated circuit devices.

The foregoing and other objects, features and advantages of the invention will be apparent from the more particular description of the preferred embodiments of the invention, as illustrated in the accompanying drawings.

BRIEF DESCRIPTION OF THE DRAWINGS

In the drawings, like elements are designated with similar reference numbers, and identical elements are designated by identical reference numbers.

DESCRIPTION OF THE PREFERRED EMBODIMENT

Figure 1:
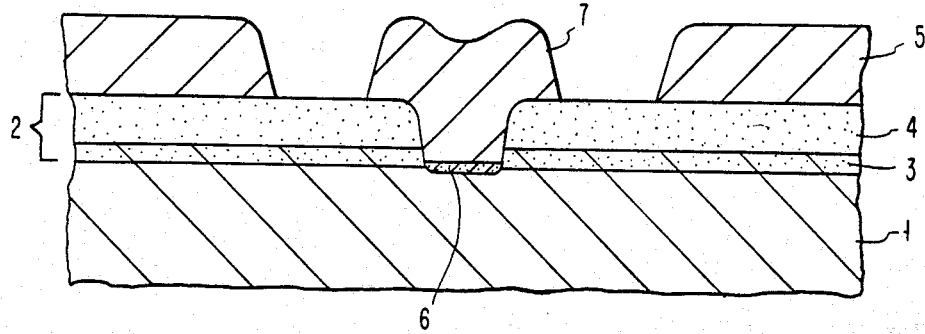
FIG. 1 is a cross sectional partial view of a partially fabricated Josephson junction wafer after metallization patterning etch and post-etch anodization according to the invention.

FIG. 1 illustrates in cross section a portion of a Josephson integrated circuit intermediate process wafer in which a groundplane exposing pinhole has been sealed with a sealant layer of niobium pentoxide, by post-etch anodization according to this invention.

Niobium groundplane 1 has its surface protected by composite insulating/spacing etch-stop layer 2, which in turn is made up of niobium pentoxide insulating layer 3 and silicon monoxide spacing etch-stop layer 4. A metallization layer 5 applied over the composite insulating/spacing etch-stop layer 2 has been selectively etched, to leave a metallization pattern. The metallization patterning etch also aggravated a pinhole site in the insulating/spacing etch-stop composite layer 2, by a modality such as loosening a contaminant particle, temporarily exposing a tiny area of niobium metal in groundplane 1 prior to the sealing of the pinhole in accordance with this invention. The process of this invention provides small niobium pentoxide sealant layers 6 to be grown by anodizing the temporarily exposed tiny area of niobium groundplane metal at the pinhole site, sealing the pinhole in insulating/spacing etch-stop layer 2. Subsequently applied M3 metallization 7 does not have an unwanted conductive connection to groundplane 1 at the pinhole site because the pinhole is sealed by the niobium pentoxide sealant layer which is specific to that pinhole site.

Figure 2:
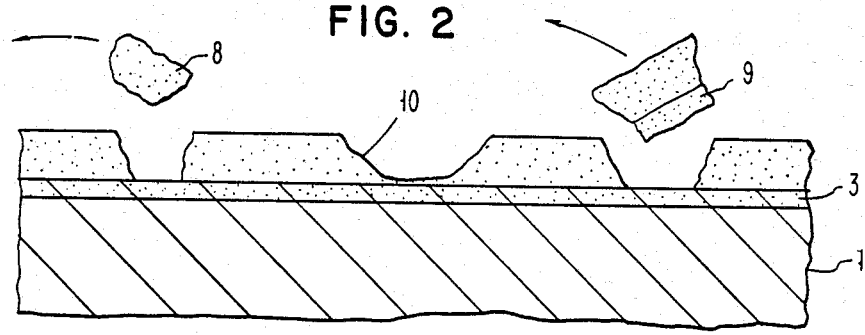
FIG. 2 is a cross sectional partial view, similar to that of FIG. 1, before metallization and metallization patterning etch, illustrating several types of modalities by which pinhole sites may be created.

FIG. 2 illustrates possible modalities by which pinhole sites develop, at the locations of microscopic particles such as clumps 8 and flakes 9. Pinhole sites may also develop at locations 10 where the silicon monoxide layer is thin or discontinuous, or where the silicon monoxide layer is otherwise weak. In the case of particles, such particles as might be present during the deposition of silicon monoxide insulating etch-stop layer 2 may cause shadows to be cast on the surface of niobium pentoxide insulating layer 3. This prevents the silicon monoxide layer 4 from forming a smooth continuous layer, but rather results in the creation of pinhole sites. At these pinhole sites the niobium pentoxide and silicon monoxide do not form a smooth composite insulating/spacing etch-stop layer. The particle, if not earlier dislodged, is not encapsulated sufficiently to keep it from being dislodged in subsequent processing, particularly during the metallization patterning etch for the M2 metallization pattern. Early dislodged particles may leave pinhole sites of weak silicon monoxide. Remaining particles may be undercut and dislodged during the metallization patterning etch step, leaving the silicon monoxide etch-stop weak or missing at the pinhole site. The etchant etches through the weak silicon monoxide etch-stop at the pinhole site, etches through the niobium pentoxide (unprotected at the site because the silicon monoxide etch-stop is missing) and slightly into the exposed groundplane niobium metal. The result is a groundplane metal exposing pinhole, which is subject to unwanted conductive contact with subsequent metallization patterns.

Figure 3:
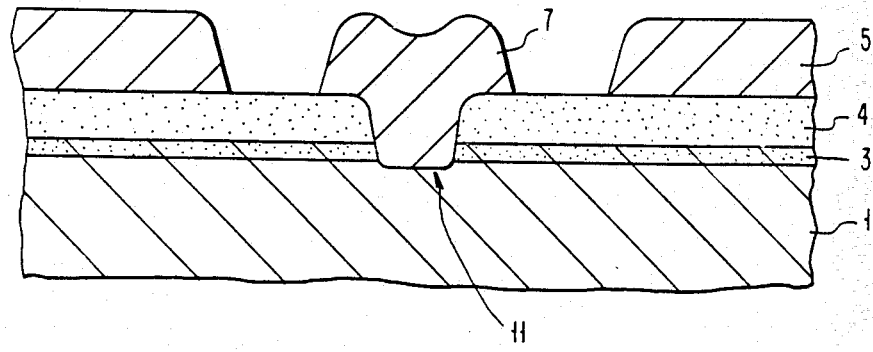
FIG. 3 (PRIOR ART) is a cross sectional partial view, similar to that of FIG. 1, of a partially fabricated Josephson junction wafer after metallization patterning etch and subsequent metallization, showing an unwanted conductive path formed in the absence of the protection of post-etch anodization according to this invention.

FIG. 3, marked "PRIOR ART," illustrates in cross section a portion of a Josephson integrated circuit wafer in which the deleterious effects of a groundplane metal exposing pinhole are permitted to run their course, omitting the post-etch anodization according to this invention. The result is that M3 metallization 7 makes unwanted contact to groundplane 1 at groundplane exposing pinhole site 11. The wafer is faulty, and should not be used in further processing.

INTERMEDIATE PROCESS WAFER

The result of processing an integrated circuit wafer according to the invention is an intermediate process wafer useful as a starting point for further processing toward a complete integrated circuit wafer. The integrated circuit wafer, when completed, may be diced into chips, packaged and incorporated in a system with other integrated circuits to perform as a computer or other electronic apparatus. FIG. 1 illustrates the Josephson junction integrated circuit intermediate process wafer according to the invention. Subsequent processing will provide the insulating barrier layers and additional electrode metallization for making the actual Josephson junctions. Metallization layers and insulation layers are added in process steps involving metallization, masking and etching. It is common in Josephson junction technology to identify metallization pattern layers as M1(groundplane), M2, M3, etc., and to identify insulation layers similarly as I1, I2, etc. Process steps are sometimes referred to by using these designations. These process steps, subsequent to the M3 metallization patterning etch, by their nature are relatively unlikely to damage the silicon monoxide insulating etch-stop layer.

After exposure to process steps known to cause groundplane exposing pinholes, notably the M2 patterning etch and previous handling steps, the post-etch anodization process of this patent specification is used to provide seals for the groundplane exposing pinholes by growing metal oxide on the metal exposed in the pinhole itself. (The growths of niobium pentoxide which form the seals are limited to the sites of the metal exposing pinholes themselves because no other metal near the pinhole is exposed. Of course other areas may be deliberately left exposed to anodization.) The seals have insulating and expansion characteristics similar to the niobium pentoxide insulating layer already present in the vicinity of the sites.

Thickness dimensions of the various layers are subject to the needs of the particular Josephson integrated circuit devices, but for a typical device the following thicknesses are appropriate:

Groundplane 1: Substantial
Niobium pentoxide 3: 700 Angstroms
Silicon monoxide 4: 1750 Angstroms
Metallization M2 5: Substantial
Post-etch anodization: 350 Angstroms The thickness of the post-etch anodization layer of niobium pentoxide is selected at about half the thickness of the original niobium pentoxide (a ratio of 1:2:5 post-etch anodization niobium pentoxide:original niobium pentoxide:silicon monoxide). This thickness provides a satisfactory pinhole sealant without requiring possibly deleterious anodization voltages.

If another dielectric oxide should be selected rather than silicon monoxide, the different dielectric properties might require a different thickness ratio. The ratio for the other dielectric oxide is 1:2:x (where x is the thickness chosen to provide the desired transmission line characteristic impedance.

POST-ETCH ANODIZATION PROCESS

Post-etch anodization may be performed on the equipment used to provide the original niobium pentoxide layer. Patterned photoresist is formed over all areas on the wafer that are not to be exposed to the post-etch anodization medium.

Electrical contact is made to the groundplane at the anodization connection, by suitable contacts which will not contaminate the anodizing medium. For wafer processing, platinum wire rings of diameter slightly smaller than the wafer diameter are effective. The platinum ring may be part of the jig which holds the wafer in the anodization apparatus, along with other wafers and their associated anodization counterelectrodes.

The anodization medium consists of a mixture of 4000 ml of ethylene glycol to 365 grams of ammonium pentaborate, vigorously stirred to accomplish complete solution. The anodization is conducted (for a wafer with a typical circuit metallization pattern) at a current density of 0.17 milliamperes per wafer of diameter $2\frac{1}{4}$ inches (5.8 centimeters) at a limiting voltage of 16 volts for 10 minutes. This produces approximately 350 Angstroms thick niobium pentoxide in fully exposed pinhole niobium.

The wafers are removed from the anodization medium, rinsed in deionized water to a resistivity of 10 megohms and spun dry. The Josephson junction integrated circuit intermediate process wafers, with M2 metallization patterned and with pinholes sealed, are ready for subsequent masking and etching steps.

What is claimed is:

1. A process for producing low temperature integrated circuit intermediate process wafers, having steps including the production of one or more large metal groundplane areas, covering the groundplane with a composite insulating/spacing etch-stop layer of grown oxide and an overlying deposited oxide, subsequently carrying out deposition and patterning steps for one or more layers of metallization, one or more of such steps being sufficiently corrosive as to present a finite probability of opening pinholes in the composite insulating/spacing etch-stop layer characterized by a step of post-etch anodizing the integrated circuit wafer to grow sealant layers of groundplane metal oxide at sites of groundplane metal exposing pinholes, to seal such pinholes permanently prior to further processing steps.

2. The process of claim 1 further characterized in that the groundplane metal is niobium; the composite insulating/spacing etch-stop layer is niobium pentoxide grown oxide of said niobium groundplane metal of thickness approximately 700 Angstroms/silicon monoxide of thickness approximately 1750 Angstroms; and said post-etch anodizing step is carried out in a medium of ethylene glycol/ammonium pentaborate solution at a limiting voltage of approximately 16 volts and a current of approximately 0.17 milliamperes per 5.8 centimeter diameter wafer.

* * * * *